United States Patent
Flemish et al.

[11] Patent Number: 6,159,884
[45] Date of Patent: Dec. 12, 2000

[54] METHOD OF ANNEALING SILICON CARBIDE FOR ACTIVATION OF ION-IMPLANTED DOPANTS

[75] Inventors: Joseph R. Flemish, Westfield; Honghua Du, Mapelwood, both of N.J.

[73] Assignee: The United States of America as represented by the Secretary of the Army, Washington, D.C.

[21] Appl. No.: 09/356,817

[22] Filed: Jul. 19, 1999

Related U.S. Application Data

[62] Division of application No. 08/657,136, Jun. 3, 1996, Pat. No. 5,981,900.

[51] Int. Cl.⁷ .......................... C04B 35/569; B23K 10/00
[52] U.S. Cl. .......................... 501/88; 264/673; 264/682; 219/121.59; 219/158; 219/420; 373/122; 373/163
[58] Field of Search .............................. 501/88; 264/673, 264/682; 219/121.59, 158, 420; 373/122, 163

[56] References Cited

U.S. PATENT DOCUMENTS

| | | | |
|---|---|---|---|
| 2,543,700 | 2/1951 | Leitten et al. | 432/262 |
| 4,165,865 | 8/1979 | Nowak et al. | 266/138 |
| 4,238,635 | 12/1980 | Saarivitta Et Aql | 13/22 |
| 5,236,353 | 8/1993 | Adari et al. | 432/198 |
| 5,573,591 | 11/1996 | Ikezawa et al. | 117/20 |
| 5,750,967 | 5/1998 | Sprauer, Jr. | 219/735 |

OTHER PUBLICATIONS

G.M. Rosenblatt, J. Electrochem. Soc. 110, p. 563 (1963). No Month.
G.M. Rosenblatt, J Electrochem. Soc. 110, p. 563 (1963). no month.
Grimley, R.T., J. Chem. Phys. 46, 3260 (1967). no month.

*Primary Examiner*—Karl Group
*Attorney, Agent, or Firm*—Michael Zelenka; John M. O'Meara

[57] ABSTRACT

A method and crucible for annealing SiC at high temperatures. The crucible is a vessel having a peripheral wall, at least two compartments separated by an inner wall within the peripheral wall and a lid which separates the compartments from the crucible surroundings while providing a passageway between the compartments. The peripheral wall, inner wall and lid are composed of materials capable of withstanding annealing temperatures. The process disposes an SiC wafer in one of the compartments and SiC powder disposed in another of the compartments. The SiC powder is present to hinder SiC wafer decomposition during annealing of the SiC wafer. The crucible is then heated to a temperature sufficient anneal the SiC wafer, preferably after evacuating air and flowing an inert gas in and around the crucible.

14 Claims, 3 Drawing Sheets

METHOD OF ANNEALING SILICON CARBIDE FOR ACTIVATION OF ION-IMPLANTED DOPANTS

This is a division of application Ser. No. 08/657,136, now U.S. Pat. No. 5,983,900 filed Jun. 03, 1996.

GOVERNMENT INTEREST

The invention described herein may be manufactured, used, imported, and licensed by or for the United States Government without the payment to us of any royalty thereon.

FIELD OF THE INVENTION

This invention relates to a method of annealing silicon carbide for activation of ion-implanted dopants.

BACKGROUND OF THE INVENTION

Electronic devices fabricated from semiconducting silicon carbide (SiC) have many applications in high-temperature power electronics. When fabricating devices it is frequently necessary to introduce electrically active impurities, i.e. dopants, into semiconductor materials to alter their electrical characteristics. These dopants can be introduced by known methods of ion-implantation. For a general reference see for example S. M. Sze, "Semiconductor Devices Physics and Technology," p. 420 (Wiley & Sons, New York, 1985). However, in order to activate the dopants and heal the damage to semiconductor crystals caused by the implantation process, it is necessary to anneal the semiconductor at very high temperatures. For SiC, this temperature is in the range of 1400° C. to 1600° C. See H. G. Bohn, J. M. Williams, C. J. McHargue, and G. M. Begun, "Recrystallization of ion-implanted a-SiC," J. Mater. Res. 2 (1), p.107 (1987). One problem associated with annealing SiC in this temperature range is that thermal pitting or etching of the SiC can occur in an improperly maintained annealing environment. See M. Ghezzo et al. "Nitrogen-Implanted SiC Diodes Using High-Temperature Implantation," IEEE Electron Device Letters 13 (12), p. 639 (1992). This problem has been in part responsible for limiting the ability to effectively make p-type (aluminum doped) SiC by ion implantation methods. Based on thermodynamic modeling of the high-temperature SiC environment, two causes for this problem have been determined. First, SiC decomposes to a mixture of solid carbon and gaseous species of Si, Si2C, SiC and SiC2. Second, any trace amount of oxygen or water vapor in the environment will react to form gaseous SiO and CO. Attempts have been made to solve the problem by creating a thermodynamically stable environment for the SiC during the annealing process. With limited success, SiC wafers have been annealed in crucibles fabricated from SiC or by placing the wafers face-to-face with a sacrificial piece of SiC to impede the degradation of the material. See M. Ghezzo et al. "Nitrogen-Implanted SiC Diodes Using High-Temperature Implantation," IEEE Electron Device Letters 13 (12), p. 639 (1992) and J. R. Flemish et al. "Implantation and Activation of Aluminum in 6 H-SiC," J. Electrochem. Soc. 142(9), L144 (1995). Accordingly, there exists a need in the art to provide a method of annealing SiC devices without degrading the device. The present invention addresses this need.

SUMMARY OF THE INVENTION

The present invention presents a method for annealing SiC at high temperatures with no apparent degradation to the material. It utilizes a covered crucible constructed of either graphite, SiC coated graphite, or inert material with two interior compartments. One compartment houses a supply of SiC powder and the other compartment houses the SiC wafer to be annealed. The role of the SiC powder is to provide a large effective surface area from which sublimation of the gaseous species can occur, the result of which is to maintain an equilibrium concentration of these species, thus sparing sublimation of the SiC wafer. Moreover, the powder serves to react with trace amounts of oxygen or water vapor which are unintentionally present in the environment. The crucible provides a local containment for the vapor species in equilibrium with the SiC.

The invention provides an article which comprises (a) a crucible which comprises a vessel having a peripheral wall, at least two compartments separated by an inner wall within the peripheral wall, a lid which separates the compartments from the crucible surroundings while providing a passageway between the compartments; said peripheral wall, inner wall and lid are composed of materials capable of withstanding annealing temperatures;

(b) an SiC wafer disposed in one of the compartments; and (c) SiC powder disposed in another of the compartments, the SiC powder being present in an amount sufficient to hinder SiC wafer decomposition during annealing of the SiC wafer.

The invention further provides a method for annealing SiC at high temperatures which comprises (a) providing a crucible which comprises a vessel having a peripheral wall, at least two compartments separated by an inner wall within the peripheral wall and a lid which separates the compartments from the crucible surroundings while providing a passageway between the compartments; said peripheral wall, inner wall and lid being composed of materials capable of withstanding annealing temperatures;

(b) disposing an SiC wafer in one of the compartments;

(c) disposing SiC powder in another of the compartments, the SiC powder being present in an amount sufficient to hinder SiC wafer decomposition during annealing of the SiC wafer;

(d) heating the crucible to a temperature sufficient anneal the SiC wafer.

BRIEF DESCRIPTION OF THE DRAWINGS

These and other objects, features, and details of the invention will become apparent in light of the ensuing detailed disclosure, and particularly in light of the drawings wherein.

DETAILED DESCRIPTION

Figure 1A:
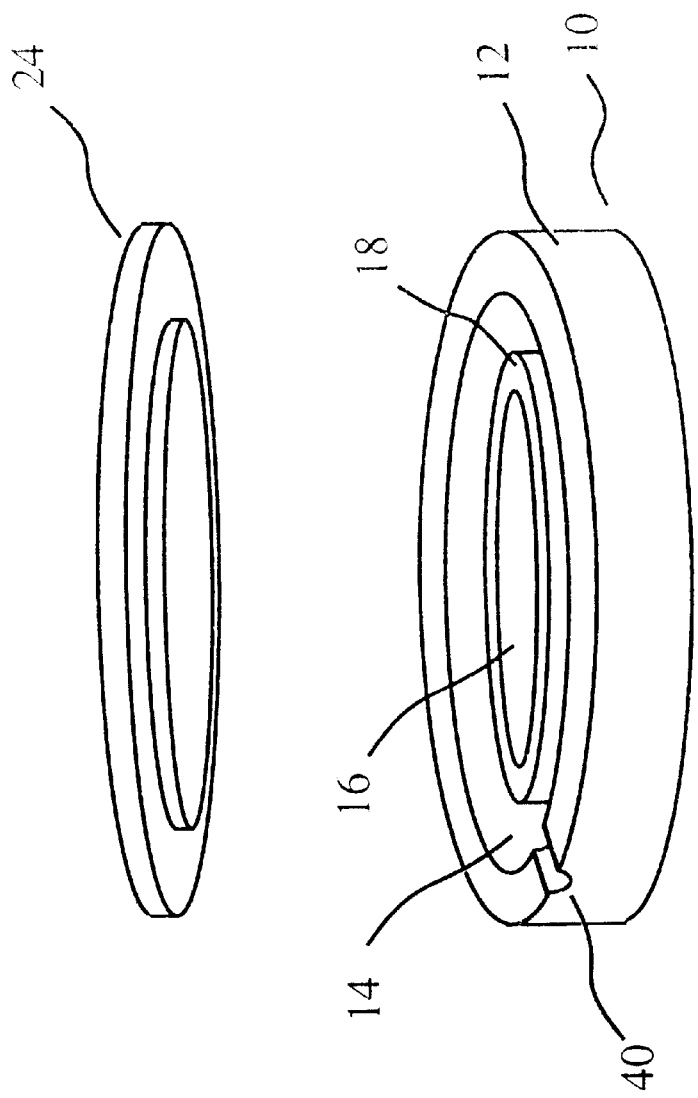
FIG. 1a shows a perspective view of a lidded crucible useful for the invention.
Figure 1B:
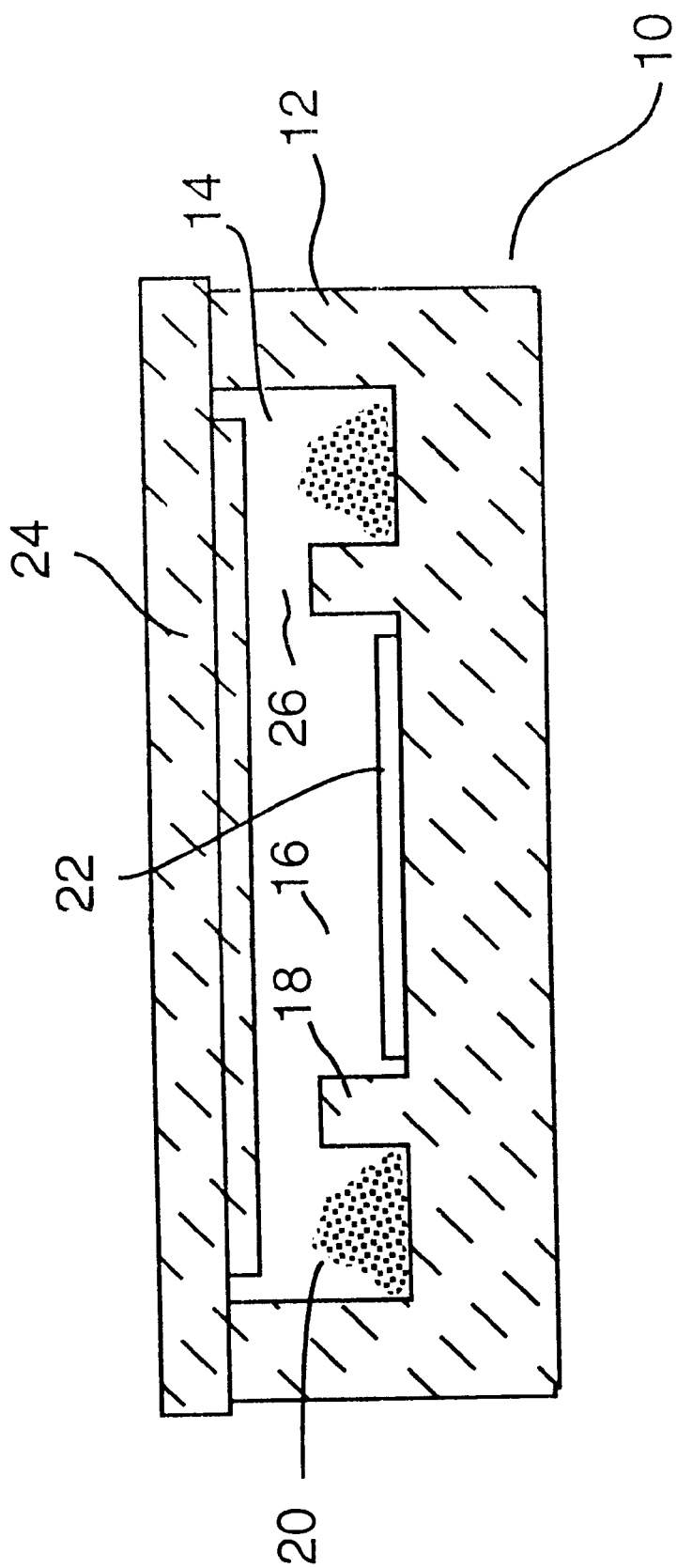
FIG. 1b shows a side cross-sectional view of a lidded crucible useful for the invention.

The invention provides an article and method for annealing SiC wafers at high temperatures without degradation to the wafer material. It utilizes a lidded crucible 10 constructed of either graphite, SiC coated graphite, or inert material as shown in FIGS. 1a and 1b. The crucible is preferably cylindrical, although it can be of any shape. Crucible 10 has an exterior peripheral wall 12 enclosing two interior compartments 14 and 16 separated by an inner wall 18. Compartment 14 houses a supply of SiC powder 20 and inner compartment 16 houses the SiC wafer 22 to be annealed. The SiC powder provides a large effective surface area from which sublimation of heat generated gaseous species can occur, the result of which is to maintain an equilibrium concentration of these species, thus sparing the SiC wafer from decomposition. The powder serves to react with trace amounts of oxygen or water vapor which are unintentionally present. Powders having a particle size of several to tens of micrometers are well suited for this application. The crucible provides a local containment for the vapor species for the creation of an environment for the SiC which is in a state near thermodynamic equilibrium. The crucible has a lid 24 which separates the compartments from the crucible surroundings while providing a passageway 26 between the compartments.

Figure 2:
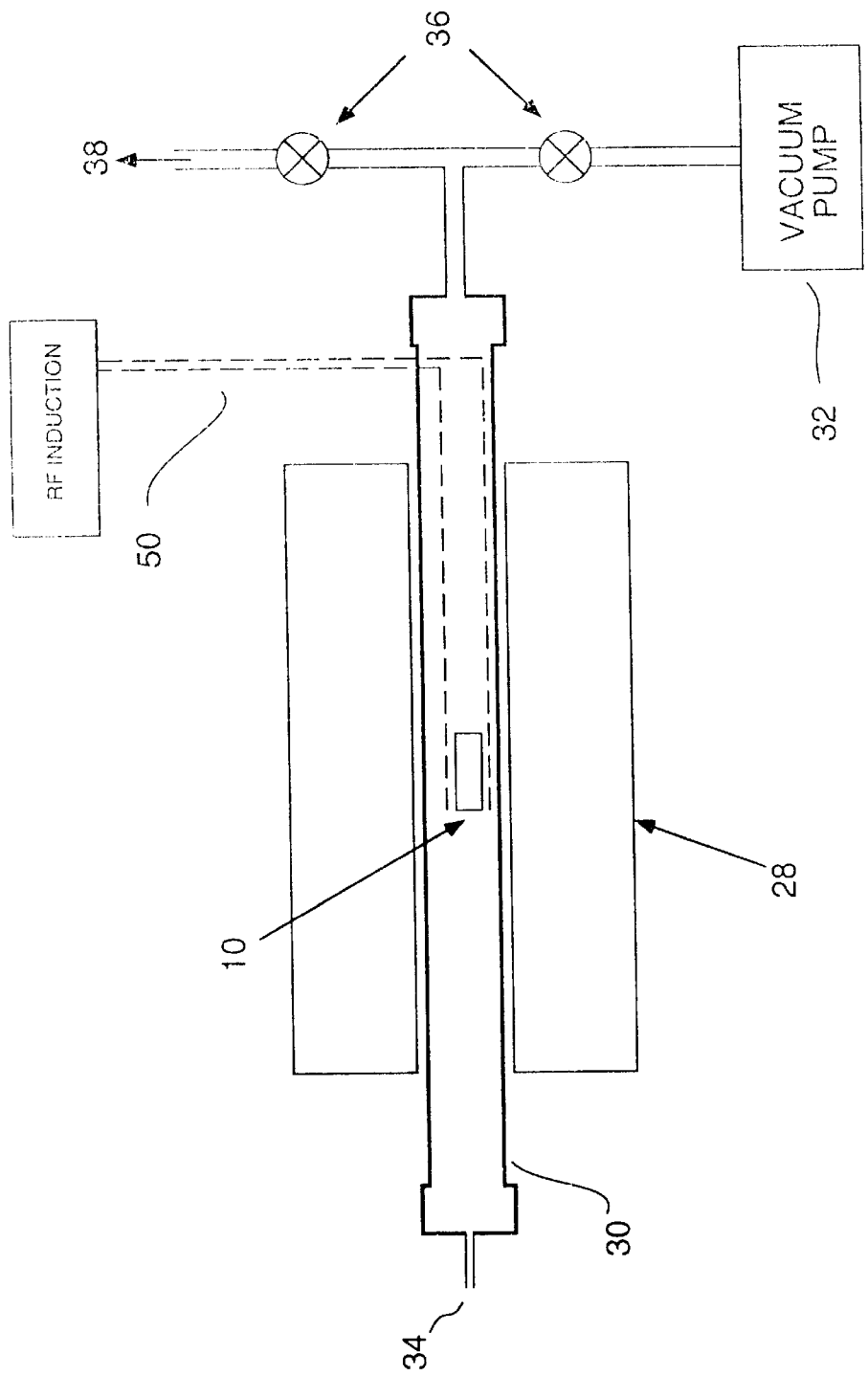
FIG. 2 shows an apparatus useful for practicing the invention wherein a crucible with SiC powder and SiC wafer are placed inside a furnace equipped with a means for flowing an inert gas through it.

In operation, as shown in FIG. 2, the crucible with the SiC powder and SiC wafer are placed inside a standard furnace 28 equipped with a means for flowing an inert gas such as argon through it. In the preferred embodiment, one may use a tube furnace comprising a process tube 30 connected to a mechanical vacuum pump 32 at the pump outlet and to a gas flow controller, not shown, at the pump inlet 34. Suitable valving 36 facilitates removal of air from the system by evacuating through vacuum pump 32 and then backfilling the tube furnace with high purity argon gas prior to heating of the crucible. The crucible has at least one small opening or orifice shown as 40 in FIG. 1$a$, similar to a Knudsen cell, so that air can be readily removed from the crucible during the evacuation/backfilling step. For an examples of a Knudsen cell, see G. M. Rosenblatt, J. Electrochem. Soc. 110, p. 563 (1963), or R. T. Grimley, J. Chem. Phys. 46, 3260 (1967). As an alternative to heating the crucible in a resistively heated furnace, it can be heated using standard alternating current (RF) induction heating means as shown by block 50 of FIG. 2. The crucible is preferably heated in a moderate flow of an inert gas such as argon at a pressure slightly higher than that of the atmosphere outside the tube. Higher pressure is desired as opposed to reduced (subatmospheric) pressure due to mass-transport considerations. Lower pressure causes enhanced diffusivity and removal of the gas-phase species which volatilize from the SiC powder, with the result that the partial pressures of these species may be considerably less than their equilibrium values. The argon flow should be adequate to prevent backstreaming of air into the furnace.

What is claimed is:

1. An article which comprises
   (a) a crucible which comprises a vessel having a peripheral wall, at least two compartments separated by an inner wall within the peripheral wall, a lid which separates the compartments from the crucible surroundings while providing a passageway between the compartments; said peripheral wall, inner wall and lid are composed of materials capable of withstanding annealing temperatures;
   (b) an SiC wafer disposed in one of the compartments; and
   (c) SiC powder disposed in another of the compartments, the SiC powder being present in an amount sufficient to hinder SiC wafer decomposition during annealing of the SiC wafer.

2. The article of claim 1 wherein the SiC powder is present in an amount sufficient to provide a surface area sufficient to effect sublimation of gaseous species, to maintain an equilibrium concentration of these species during annealing, and to react with any trace amounts of oxygen and water vapor present during annealing.

3. The article of claim 1 wherein the peripheral wall, inner wall and lid are composed of materials capable of withstanding temperatures in the range of from about 1400° C. to about 1600° C.

4. The article of claim 1 wherein the peripheral wall, inner wall and lid are composed of graphite or SiC coated graphite.

5. The article of claim 1 wherein the peripheral wall has at least one small orifice therethrough.

6. The article of claim 1 comprising a space between the lid and the inner wall which space provides the passageway between the compartments.

7. The article of claim 1 wherein the outer wall is substantially cylindrical, the inner wall is substantially cylindrical and concentric with and within the outer wall, one of the compartments is between the inner and outer walls and another of the compartments is within the inner wall.

8. A method for annealing SiC at high temperatures comprising the steps of:
   (a) providing a crucible which comprises a vessel having a peripheral wall, at least two compartments separated by an inner wall within the peripheral wall and a lid which separates the compartments from the crucible surroundings while providing a passageway between the compartments; said peripheral wall, inner wall and lid being composed of materials capable of withstanding annealing temperatures;
   (b) disposing an SiC wafer in one of the compartments;
   (c) disposing SiC powder in another of the compartments, the SiC powder being present in an amount sufficient to hinder SiC wafer decomposition during annealing of the SiC wafer;
   (d) heating the crucible to a temperature sufficient anneal the SiC wafer.

9. The process of claim 8 wherein the annealing temperature is in the range of from about 1400° C. to about 1600° C.

10. The process of claim 8 further comprising the steps of evacuating air from the crucible and then backfilling the crucible with an inert gas prior to heating.

11. The process of claim 8 wherein the crucible heating is conducted in a furnace under an inert gas atmosphere.

12. The process of claim 8 wherein the inert gas comprises argon.

13. The process of claim 8 wherein the crucible is heated by an alternating current (RF) induction means.

14. The process of claim 11 further comprising the step of pressurizing the crucible.

* * * * *